United States Patent [19]

Akiyama

[11] Patent Number: 4,816,916
[45] Date of Patent: Mar. 28, 1989

[54] CCD AREA IMAGE SENSOR OPERABLE IN BOTH OF LINE-SEQUENTIAL AND INTERLACE SCANNINGS AND A METHOD FOR OPERATING THE SAME

[75] Inventor: Ikuo Akiyama, Tokyo, Japan

[73] Assignee: NEC Corporation, Japan

[21] Appl. No.: 102,104

[22] Filed: Sep. 29, 1987

[30] Foreign Application Priority Data

Sep. 30, 1986 [JP] Japan .................................. 61-230766

[51] Int. Cl.[4] .............................................. H04N 3/14
[52] U.S. Cl. ............................. 358/213.29; 358/213.26
[58] Field of Search ..................... 358/213.22, 213.29, 358/213.31, 909, 212

[56] References Cited

U.S. PATENT DOCUMENTS

| | | | |
|---|---|---|---|
| 3,777,061 | 12/1973 | Takemura ....................... | 358/213.22 |
| 4,301,471 | 11/1981 | Holscher et al. ................... | 358/212 |
| 4,486,783 | 12/1984 | Tanaka et al. ................... | 358/213.29 |
| 4,551,758 | 11/1985 | Masunaga et al. .............. | 358/213.22 |
| 4,581,652 | 4/1986 | Kinoshita et al. ............... | 358/213.31 |
| 4,623,623 | 4/1986 | Woo et al. ........................ | 358/213.29 |

FOREIGN PATENT DOCUMENTS 0220576 12/1983 Japan ............................... 358/213.29

Primary Examiner—Jin F. Ng
Assistant Examiner—Stephen Brinick
Attorney, Agent, or Firm—Laff, Whitesel, Conte & Saret

[57] ABSTRACT

A CCD area image sensor includes, on a single semiconductor chip, a matrix of imaging elements, a plurality of vertical shift registers formed in parallel with rows of the matrix, a first horizontal shift register formed on one side of the matrix, a plurality of lines of CCD memories formed on another side of the matrix opposite to the one side, a second horizontal shift register formed on the same side of the matrix as the lines of CCD memories and first and second charge detectors formed at ends of the first and second horizontal shift registers. The method for operating the CCD area image sensor to produce signals with interlace and line sequential scannings is also described.

10 Claims, 4 Drawing Sheets

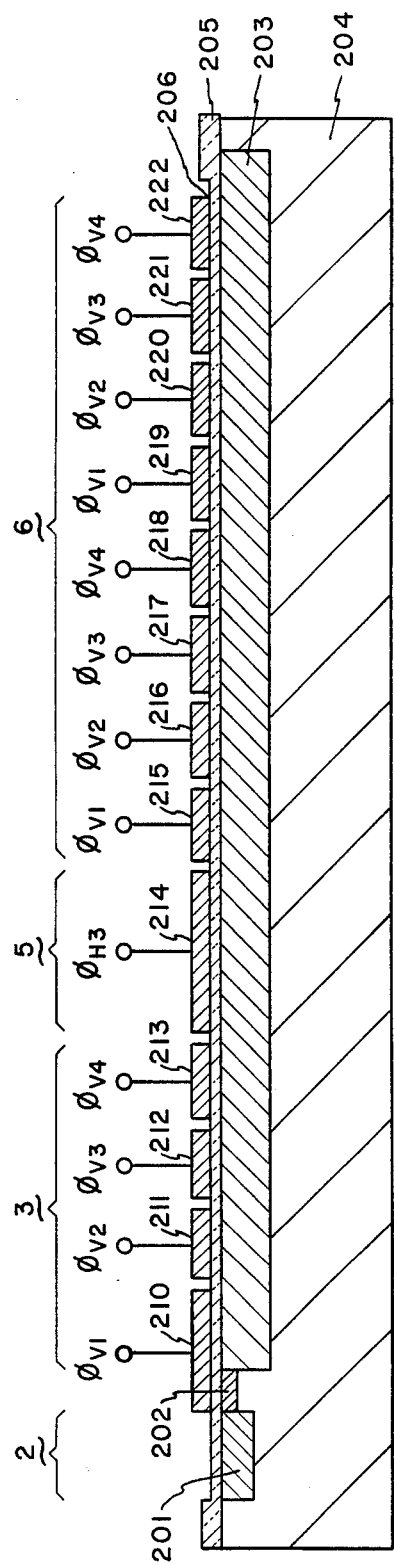
FIG. 4
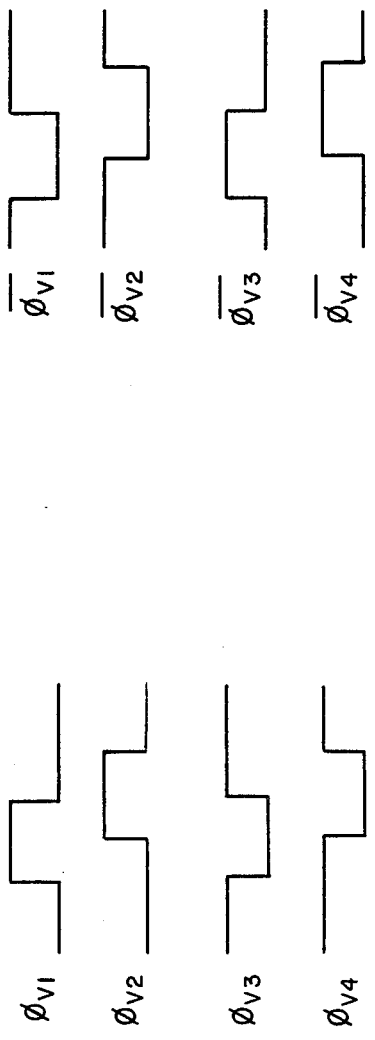
FIG. 5(a)
FIG. 5(b)

CCD AREA IMAGE SENSOR OPERABLE IN BOTH OF LINE-SEQUENTIAL AND INTERLACE SCANNINGS AND A METHOD FOR OPERATING THE SAME

BACKGROUND OF THE INVENTION

1. Field of the Invention

This invention relates to a CCD (Charge Coupled Device) area image sensor and its operating method, and more particularly to a structure of the CCD area image sensor for being driven in both of line sequential scanning and interlace scanning and a method for driving it in a line sequential scanning.

2. Description of the Related Art

Since a required band width for processing a video signal sensed by the interlace scanning is a half of a video signal sensed by the line sequential scanning, the interlace scanning has been widely used in the television standard systems of various nations, the industrial television systems and so on. However, the interlace scanning causes a considerable deterioration of reproduced picture such as an interline flicker noise. Due to the deterioration, new television systems are planned to use the line sequential scanning to improve the definition of the reproduced picture.

As for the imaging devices, the development of the CCD area image sensors is outstanding. Those CCD image sensors obtainable in the market are all designed for the interlace scanning. The CCD area image sensors for the line sequential scanning cannot be obtained in the present market. There are two main reasons for this market condition. First, the CCD area image sensors are manufactured to be used in home-use video cameras which is only one market having a large demand. Second, it is technically difficult to form CCD vertical shift register having a very small electrode pitch required in the CCD area image sensors for the line sequential scanning. The electrode pitch in the image sensors for the line sequential scanning is a half of the image sensors for the interlace scanning, because, although transfer gate electrodes of one stage in the vertical shift register of the image sensor for the line sequential scanning are arranged for each sensing element, those of the image sensor for the interlace scanning correspond to each two sensing elements.

Furthermore, as above-mentioned, the CCD image sensors for the line sequential scanning and the interlace scanning have different structures. The scanning method is limited in accordance with the structure of the CCD image sensors. The CCD image sensor usable in both scanning systems is not devised.

One measurement for using one image sensor in both scanning systems may be to change sequence of output signals from an area image sensor by an external circuit. That is, output signals in two fields are derived from an area image sensor by the interlace scanning to be stored in a memory, and then the output signals of each picture elements in the two horizontal lines are alternatively read out from the memory.

However, since the output signal in one field is photo-charges accumulated in sensing elements for two field periods prior to the output operation, the photo-charge accumulation periods for the output signals in two fields which are to be synthesized overlap one field period, resulted in a deteriorated dynamic resolution (i.e. a resolution of moving picture). Moreover, a large-scale external circuit is required for synthesizing the output signals in two field. Especially, there need an expensive field memory, synthesizing switching means, many line memories and other circuits for driving them. Therefore, the external circuit is very expensive and has a very complicated structure.

SUMMARY OF THE INVENTION

It is, therefore, a primary object to provide a CCD area image sensor operable in a line sequential scanning and in an interlace scanning and a method for operating the same in the line sequential scanning.

It is another object to provide a CCD area image sensor operable in both of line sequential and interlace scannings with a simple external circuit.

In accordance with a first feature of the present invention, there is provided a CCD area image sensor formed on a single semiconductor chip and including a plurality of light sensing elements formed in an imaging region of the semiconductor chip and arranged in rows and columns, a plurality of vertical shaft registers disposed in parallel with respective columns of the light sensing elements, means for transferring charges accumulated in the light sensing elements to the vertical shift register, a first horizontal shift register formed outside the imaging region in parallel with the rows of the light sensing elements to receive carriers shifted through the vertical shift registers, a first charge detector converting a quantity of charges transferred through the first horizontal shift register into first electrical signals, a second horizontal shift register disposed outside the imaging region on the side opposite to the first horizontal shift register, a plurality of lines of CCD memories arranged to receive charges transferred through respective vertical shift registers and across the second horizontal shift register, and a second charge detector converting charges transferred through the second horizontal shift register into second electrical signals, the second horizontal shift register receiving charges transferred through lines of CCD memories.

In accordance with a second feature of the present invention, there is provided a method for driving the CCD area image sensor according to the first feature of the present invention in a line sequential scanning, which includes steps of accumulating charges in the light sensing elements in accordance with light incident upon the imaging region, transferring the charges accumulated in every other light sensing element in the respective columns to the vertical shift registers, transferring the charges transferred to the vertical shift registers to the lines of CCD memories, transferring charges accumulated in the remaining light sensing elements to the vertical shift registers, alternatively shifting charges of one scanning line stored in the lines of CCD memories and the vertical shift registers to the second and first charge detectors, respectively, through the second and first horizontal shift registers.

The CCD area image sensor of the present invention can be driven in either line sequential scanning or interlace scanning by changing clock pulses to the applied to the vertical shift registers, the first and second horizontal shift registers and the lines of CCD memories. These requires no external circuit to drive the CCD area image sensor in the interlace scanning. Only one external circuit is required to drive it in the line sequential scanning. Furthermore, if the charge transfer to the lines of CCD memories is carried out in a vertical blanking period, the first and second electrical signals of image signal in a line sequential scanning can be derived in the following vertical scanning period. In this manner, every first and second electrical signal correspond to image information applied for a duration of every one field. As a result, the dynamic resolution of moving picture is improved.

The vertical shift registers have one transfer stage for every two light sensing elements, similar to the conventional vertical shift register in the CCD area image sensor for the interlace scanning. The device structure does not include such minute pattern that the production is difficult. The CCD area image sensor of the present invention can be easily manufactured by the present production technique.

BRIEF DESCRIPTION OF THE DRAWINGS

The above and further objects, features and advantages of the present invention will become more apparent from the following detailed description taken in conjunction with the accompanying drawings, wherein:

FIG. 4 is a sectional view taken along X—X' in FIG. 3;

FIG. 5(a) is a waveform of clock pulses $\phi V1$ to $\phi V4$ and FIG. 5(b) is a waveform of clock pulses $\phi V1$ to $\phi V4$ by which the shifting direction of the vertical shift registers are opposite, compared to a case using the clock pulses $\phi V1$ to $\phi V4$;

Figure 1:
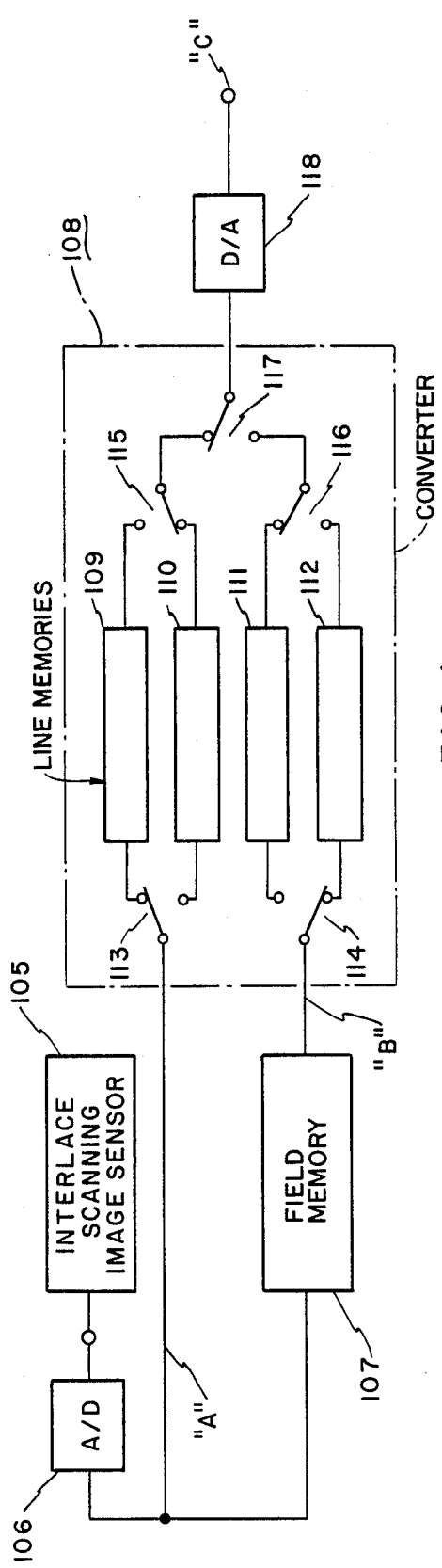
FIG. 1 is a block diagram showing a circuit in the prior art in which signal is changed to other scanning type signal outside an image sensor.

Apparatus in the prior art in which a signal obtained from an image sensor by an interlace scanning is changed into other signal taken by a line sequential scanning is shown in FIG. 1. The apparatus is combined with the image sensor so that the signal is processed outside the image sensor.

Figure 2:
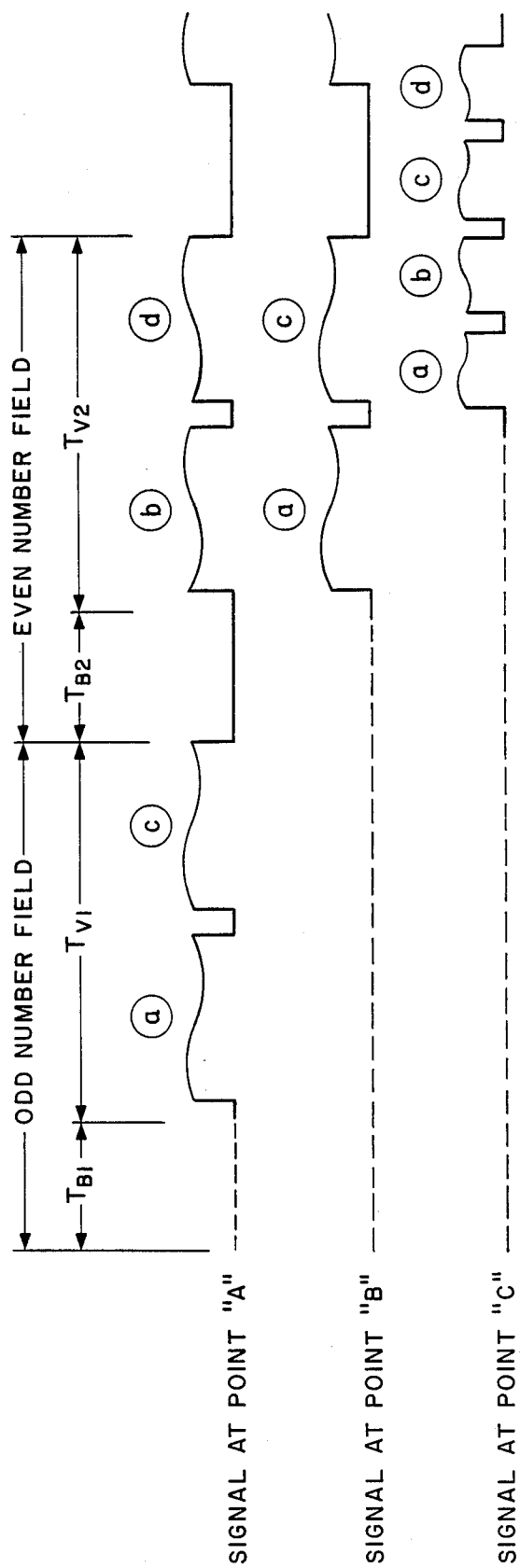
FIG. 2 is a waveform of signals at various points of the block diagram of FIG. 1.

The signal derived from an image sensor 105 by an interlace scanning is applied to an analog-to-digital converter 106 to obtain a signal at a point "A" shown in FIG. 2 in which wave shape is shown in a continuous form only for a simplification and a picture is assumed to be sensed by four sequential horizontal lines ⓐ, ⓑ, ⓒ and ⓓ. In an odd number field, alternate horizontal lines ⓐ and ⓒ are taken out, followed by an even number field to take the remaining horizontal lines ⓑ and ⓓ. Those signals at the horizontal lines ⓐ, ⓑ, ⓒ and ⓓ are derived at vertical scanning periods $T_{V1}$ and $T_{V2}$ which are respectively followed by vertical blanking periods $T_{B1}$ and $T_{B2}$.

The signals ⓐ and ⓒ taken out in the odd number field is once stored in a field memory 107 and then applied to a converter 108 in a duration of the following even number field. The converter 108 has four line memories 109 to 112. When the signal at the horizontal line ⓑ is derived, the signal at the horizontal line ⓐ is stored in the line memory 112 from the field memory 107 by a switch 114. Simultaneously, the derived signal at the horizontal line ⓑ is stored in the line memory 109 by a switch 113.

When the signal at the horizontal line ⓔ is derived, the signal at the horizontal line ⓒ is stored in the line memory 111 from the field memory 107 by the switch 114. Simultaneously, the derived signal at the horizontal line ⓔ is stored in the line memory 110 by the switch 114. The signal at a point "B" is shown in FIG. 2. During this period, the signals stored in the line memories 112 and 109 are sequentially red out to a digital-to-analog converter 118 through switches 115, 116 and 117. After this period, the signals stored in the line memories 111 and 110 are sequentially red out to the digital-to-analog converter 118. As a result, a series of signals at horizontal lines ⓐ, ⓑ, ⓒ and ⓓ is derived at a point "C" in every two interlace scanning fields. Above-mentioned processing sequence is repeated.

The apparatus for changing signal from the interlace scanning to the line sequential scanning requires expensive or large-scale parts such as the analog-to-digital converter 106, the field memory 107, many of the line memories 109 to 112, the digital-to-analog converter 118 and a controller of switches 113 to 117. The employment of such apparatus increases production cost of imaging device for the line sequential scanning and causes a difficulty for miniaturization of the same device.

Furthermore, a CCD image sensor may be used as the image sensor 105 in FIG. 1. In such a case, however, sensing elements for the signals ⓐ and ⓒ accumulate charges in response to light incident thereon for odd and even number fields prior to their reading operation. Similarly, other sensing elements for the signals ⓑ and ⓓ accumulate charges in response to light incident thereon for even and odd number fields prior to their reading operation. As a result, the light during even number field just prior to the odd number field shown in FIG. 2 is commonly sensed by the sensing elements for the signals ⓐ and ⓒ and other sensing elements for the signals ⓐ and ⓓ. This overlaping of sensing term results in a deterioration of dynamic resolution or a resolution of moving picture.

DESCRIPTION OF THE PREFERRED EMBODIMENTS

Figure 3:
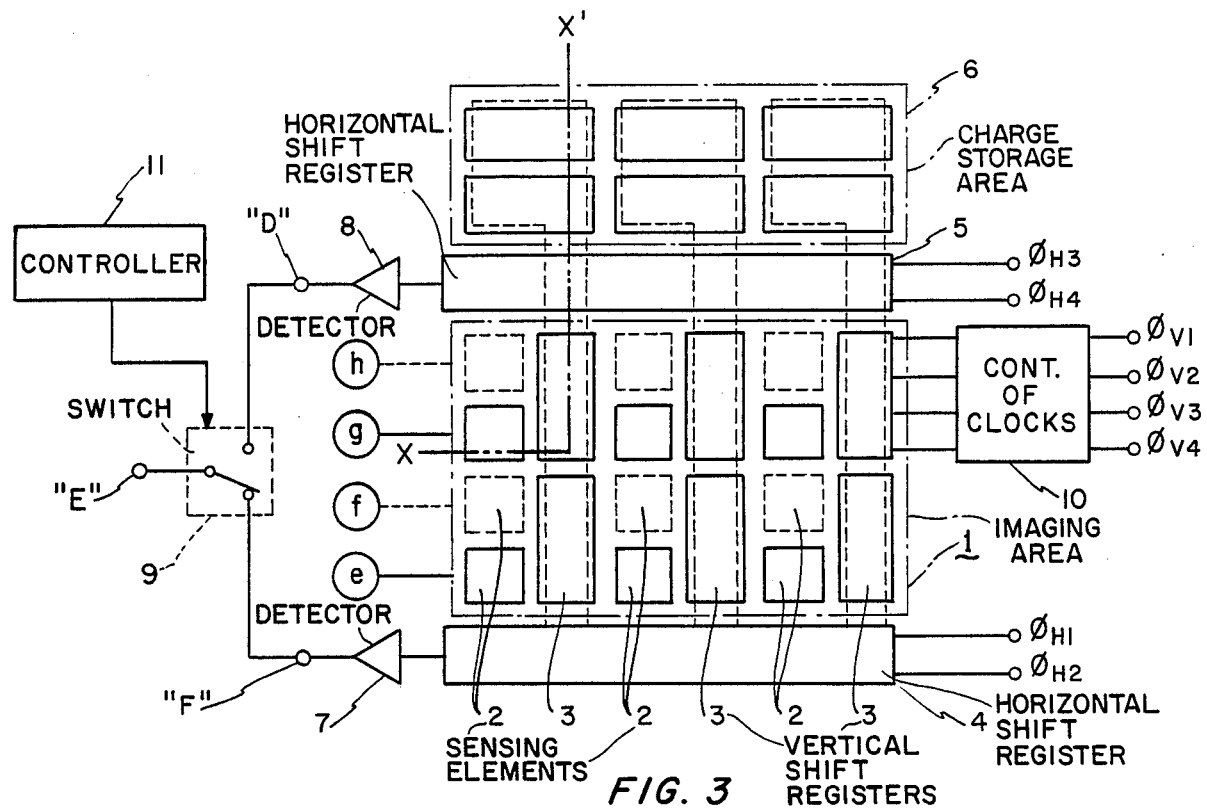
FIG. 3 is a plan view showing a CCD area image sensor according to a first preferred embodiment of the present invention.

A CCD area image sensor shown in FIG. 3 is formed on a single semiconductor chip except for a switch 9 which may be also formed on the same semiconductor chip. An imaging area 1 has a plurality of sensing elements 2 arranged in rows and columns and a plurality of vertical shift registers 3 each of which is disposed beside and in parallel with corresponding column of sensing elements 2. In an actual image sensor, the imaging area 1 has 485 sensing elements in every columns and 418 sensing elements in every rows, so as to reproduce an imaged picture by the line sequential scanning with a frame frequency of 60 Hz, 525 scanning lines and a horizontal scanning frequency of 31.5 KHz which are corresponding to an NTSC standard television system having a frame frequency of 30 Hz, a field frequency of 60 Hz, 525 scanning lines and a horizontal scanning frequency of 15.75 kHz. The shown embodiment, however, has four sensing elements in every columns and three sensing elements in every rows for facilitation.

Figure 6:
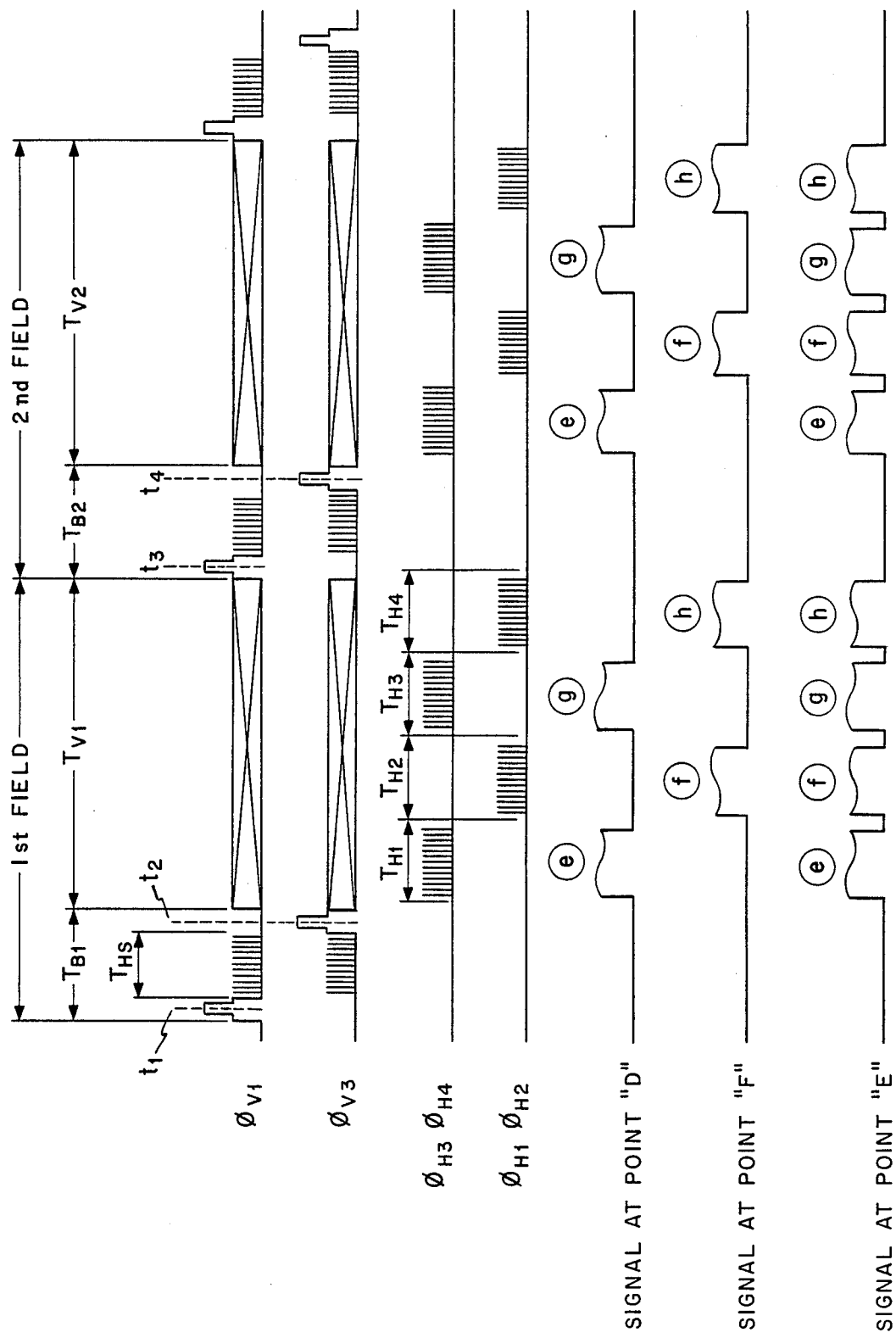
FIG. 6 is a waveform of signals at various points of the plan view of FIG. 3.

A first horizontal shift register 4 is formed on a lower side of the imaging region 1 to receive charges accumulated in the sensing elements of the horizontal lines ⓕ and ⓗ, from the vertical shift registers 3. The charges are then shifted through the first horizontal shift register 4 toward a first detector 7 to obtain a signal at a point "F", as shown in FIG. 6. A second horizontal shift register 5 is formed on an upper side of the imaging area 1. A charge storage area 6 is further formed on an upper side of the second horizontal shift register 5. The charge storage area 6 has a plurality of lines of CCD memories, each line of which correspondes to one vertical shift register 3 and has CCD memories having a number of half of the sensing elements in a column. Charges accumulated in the sending elements 2 of the horizontal lines ⓔ and ⓖ are transferred from the vertical shift registers 3 to the charge storage area 6 beyond the second horizontal shift register 5, and then transferred back from the charge storage area 6 to the second shift register 5. Thereafter, the charges are shifted through the second horizontal shift register 5 toward a second detector 8 to obtain another signal at a point "D", as shown in FIG. 6. The signals at points "D" and "F" are alternatively read out at a point "E" with a switch 9 under a control of the controller 9, as also shown in FIG. 6.

The vertical shift registers 3 has four shift gates on one stage. For shifting charges toward the first horizontal shift register 4, clock pulses $\phi V1$ to $\phi V4$ shown in FIG. 5(a) are applied to the vertical shift registers 3. The clock pulses $\phi V1$ and $\phi V3$ and the clock pulses $\phi V2$ and $\phi V4$ have different phases. The clock pulses $\phi V1$ and $\phi V2$ are respectively opposite to the clock pulses $\phi V3$ and $\phi V4$. For shifting charges toward the second horizontal shift register 5 through the vertical shift registers 3, the respective clock pulses $\phi V1$ to $\phi V4$ are inverted by the controller 10 to obtain the inverted clock pulses $\overline{\phi}V1$ to $\overline{\phi}V4$ shown in FIG. 5(b).

The horizontal shift registers 4 and 5 are driven by two phase clock pulses $\phi H1$, $\phi H2$ and $\phi H3$, $\phi H4$. The phase of the clock pulse $\phi H1$ is opposite to the clock pulse $\phi H2$. The phase of the clock pulse $\phi H3$ is opposite to the clock pulse $\phi H4$.

The sectional view of the first preferred embodiment taken along X—X' of FIG. 3 is shown in FIG. 4. The imaging elements 2 are formed in a P-type silicon substrate 204 having a resistivity of 10 to 13 ohm-cm with N-type imaging regions 201 having an impurity density of $10^{12}$ cm$^{-3}$. An N-type buried channel region 203 having an impurity density of $10^{12}$ cm$^{-3}$ is formed in the substrate 204 for the vertical shift registers 3, the horizontal shift registers 4 and 5 and the charge storage area 6. A P-type charge transfer region 203 having an impurity density of $10^{11}$ cm$^{-3}$ is formed between the N-type imaging regions 201 and the N-type burried channel region 203. A thin gate insulator film 206 of silicon dioxide covers the N-type imaging regions 201, the P-type charge transfer regions 202 and the N-type burried channel region 203. A thick oxide film 205 covers other region of the substrate 204. On the gate insulator film 206, a plurality of polycrystalline silicon gates 210 to 222 are formed. The gates 210 to 213 form a vertical shift register 3. The gates 210 and 212 are extended over the charge transfer regions 202 to the imaging regions 201. The gates 210 to 213 respectively receive the clock pulses $\phi V1$ to $\phi V4$ of FIG. 5(a) to shift charges toward the first horizontal shift register 4 and receive the inverted clock pulses $\overline{\phi}V1$ to $\overline{\phi}V4$ of FIG. 5(b) to shift charges toward the second horizontal shift register 5. The phase of applied clock pulses is controlled by the controller 10 of FIG. 3. The gate 214 belongs to the second horizontal shift register 5 and receives clock pulse $\phi H3$ or $\phi H4$. P-type impurities are doped under a part (not shown in FIG. 4) of the gate 214 to form a potential barrier for being driven by the two phase clock. The gates 215 to 222 forms the charge storage area 6 which is formed by a CCD shift register driven by four phase clock. Four gates 215 to 218 and 219 to 222 form one memory stage, respectively. The gates 215 and 219, 216 and 220, 217 and 221 and 218 and 222 respectively receive the inverted clock pulses $\overline{\phi}V1$ to $\overline{\phi}V4$ for storing charges and the clock pulses $\phi V1$ to $\phi V4$ for shifting charges toward the second horizontal shift register 5. The gates 210, 215 and 219, the gates 211, 216 and 220, the gates 212, 217 and 221 and the gates 213, 218 and 222 are respectively connected in common on the substrate 204. Therefore, the phase of clock pulses applied to the charge storage area 6 is controlled by the controller 10.

The method for operating the CCD area image sensor according to the first preferred embodiment will now be explained. The second horizontal shift register 5, the charge storage area 6 and the second detector 8 are not used for the interlace scanning. The switch 9 is fixed to connect the points "F" and "E". The vertical shift registers 3 are driven so as to shift charges toward the first horizontal shift register 4. At the end $t_2$ of the vertical blanking period $T_{B1}$, a transfer pulse is applied to the clock pulse $\phi V1$ to transfer charges accumulated in sensing elements 2 of horizontal lines ⓔ and ⓖ to the vertical shift registers 3. The transferred charges are shifted through the vertical shift registers 3 to the first horizontal shift register 4 to be read out from the first detector in the vertical scanning period $T_{V1}$. The first field including the vertical blanking period $T_{B1}$ and the vertical scanning period $T_{V1}$ corresponds to the odd number field. At the end $t_4$ of the following vertical blanking period $T_{B2}$, another transfer pulse is applied to the clock pulse $\phi V3$ to transfer charges accumulated in the sensing elements of the horizontal lines ⓕ and ⓗ to the vertical shift registers 3. The transferred charges are shifted through the vertical shift registers 3 to the first horizontal shift register 4 to be read out from the first detector 7 in the vertical scanning period $T_{V2}$. The second field including the vertical blanking period $T_{B2}$ and the vertical scanning period $T_{V2}$ corresponds to the even number field.

For operating the CCD area image sensor in a line sequential scanning, the second horizontal shift register 5, the charge storage area 6, the second detector 8 and the switch 9 are used. The operation will be explained with reference to FIG. 6. At the beginning $t_1$, a transfer pulse is applied to the clock pulse $\phi V1$ to transfer charges accumulated in the sensing elements 2 of the horizontal line ⓔ and ⓖ. Thereafter the transferred charges are shifted through the vertical shift registers 3 and transferred to the charge storage area 6 beyond the second horizontal shift register 5 during the high-speed transferring period $T_{HS}$. At this time, the gate electrodes n the second horizontal shift register 4 disposed between the vertical shift registers 3 and the lines of CCD memories in the charge storage area 6 are used to shift charges from the vertical shift registers 3 to the charge storage area 6. At the end $t_2$ of the vertical blanking period $T_{B1}$, another transfer pulse is applied to the clock pulse $\phi V3$ to transfer charges accumulated in the sensing elements 2 of remaining horizontal lines ⓕ and ⓗ to the vertical shift registers 3. Thereafter, the lines of CCD memories in the charge storage area 6 and the vertical shift registers 3 respectively shift charges of the horizontal line ⓔ to the second horizontal shift register 5 and charges of the horizontal line ⓕ to the first horizontal shift register 4. The second horizontal shift register 5 shifts charges to the second detector 8 during a first horizontal scanning period $T_{H1}$ to produce a signal at the point "D" and then at the point "E" through the switch 9. The first horizontal shift register 4 shifts charges to the first detector 7 during a second horizontal scanning period $T_{H2}$ to produce another signal at the point "F" and then at the point "E" through the switch 9. The lines of CCD memories and the vertical shift registers 3 shift charges again. The charges of the horizontal line ⓖ and the horizontal line ⓗ are respectively transferred to the second and first horizontal shift registers 5 and 4. In the third horizontal scanning period $T_{H3}$, the second horizontal shift register 5 shifts charges to the second detector 8 to produce a signal at the points "D" and "E". In the fourth horizontal scanning period $T_{H4}$, the first horizontal shift register 4 shift charges to the first detector 7 to produce a signal at the points "F" and "E". The above-explained sequence of operation is repeated in the second field and in the field following it.

In accordance with the present invention, the CCD area image sensor can selectively produce either a signal for an interlace-scanning or a signal for a line sequential scanning with a change of operation. Very little external circuit is required for those operations. The device structure of the imaging area 1 is quite similar to the CCD area image sensor for the interlace scanning and, therefore, is easily manufactured in the present processing technique.

When the signal for the line sequential scanning is produced, the sensing elements of alternate horizontal scanning lines accumulate charges in response to almost same light. The accumulation periods differs for a time duration between $t_1$ and $t_2$, which is only 7% of the accumulation period of one vertical blanking period $T_B$ and one vertical scanning period $T_V$. As a result, a high dynamic resolution is obtained.

Figure 7:
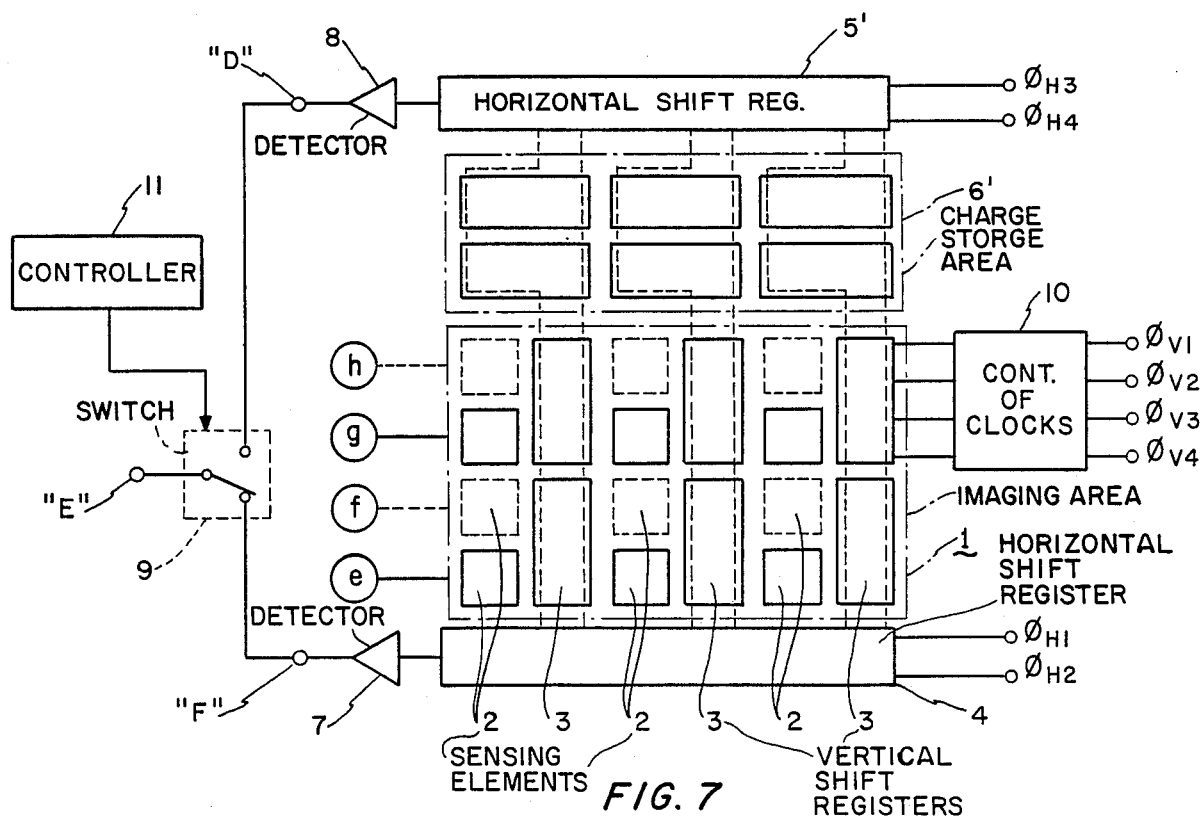
FIG. 7 is a plan view showing a CCD area image sensor according to a second preferred embodiment of the present invention.

The positions of the second horizontal shift register 5 and the charge storage area 6 may be interchanged as shown in the second embodiment of present invention of FIG. 7, as the second horizontal shift register 5' and the charge storage area 6'. In this embodiment, charges are shifted through the vertical shift registers 3 and the lines of CCD memories in the charge storage area 6' in different directions for reading them out. Therefore, for the read-out operation, the clock pulses $\phi V1$ to $\phi V4$ and the inverted clock pulses $\overline{\phi}V1$ to $\overline{\phi}V4$ are respectively applied to the vertical shift registers 3 and the charge storage area 6'.

What is claimed is:

1. A CCD area image sensor formed on a single semiconductor chip and comprising:
    a plurality of imaging elements arranged in rows and columns to form a matrix, said imaging elements accumulating charges in response to light incident thereon;
    a plurality of vertical shift registers, each vertical shift register being formed along and in parallel with a corresponding column of said imaging elements, and said vertical shift registers being capable of shifting charges in reversible directions along said columns;
    a first horizontal shift register formed outside said matrix so as to receive charges from said vertical shift registers;
    a plurality of lines and memories formed outside said matrix, each of said lines being formed in a direction of said columns so as to store charges transferred from said vertical shift registers and to shift said stored charges to one end thereof;
    a second horizontal shift register formed to receive the shifted charges from said one end of each of said lines of memories;
    a first charge detector formed at an end portion of said first horizontal shift register to produce a first electrical signal in response to charges shifted through said first horizontal shift register; and
    a second charge detector at an end portion of said second horizontal shift register to produce a second electrical signal in response to charges shifted through said second horizontal shift register.

2. The CCD area image sensor as claimed in claim 1, further comprising a switch for alternately outputting said first and second electrical signals.

3. The CCD area image sensor as claimed in claim 2, further comprising means for transferring said charges accumulated in said imaging elements of every other of said row to said lines of memories through said vertical shift registers to store said charges accumulated in said imaging elements of every other of said rows in said lines of memories; means for transferring said stored charges in said lines of memories to said second horizontal shift register and transferring said charges accumulated in said imaging elements of remaining rows to said first horizontal shift register; and means for shifting said charges transferred to one of said first and second horizontal shift registers through said one of said first and second horizontal shift registers after said charges transferred to the other of said first and second horizontal shift registers are shifted through said other of said first and second horizontal shift registers.

4. The CCD area image sensor as claimed in claim 1, wherein said second horizontal shift register is positioned between said matrix and said lines of memories, said charges transferred for said vertical shift registers being shifted to said lines of memories through said second horizontal shift register to be stored in said lines of memories.

5. The CCD area image sensor as claimed in claim 4, wherein said lines of memories are lines of CCD shift registers for reversibly shifting charges therethrough.

6. The CCD area image sensor as claimed in claim 4, further comprising a switch for alternately outputting said first and second electrical signals.

7. A method for operating a CCD area image sensor comprising:
    a plurality of imaging elements arranged in rows and columns to form a matrix, said imaging elements accumulating charges in response to light incident thereon;
    a plurality of vertical shift registers formed respectively in parallel with said columns of said imaging elements;
    a first horizontal shift register formed outside said matrix;
    a plurality of lines of memories formed outside said matrix to receive charges from said vertical shift registers;
    a second horizontal shift register formed to receive charges from said lines of memories;

a first charge-voltage converter for converting charges shifted through said first horizontal shift register into a first electrical signal;

a second charge-voltage converter for converting charges shifted through said second horizontal shift register into a second electrical signal; and a switch for selectively outputting said first and second electrical signals, said method comprising steps of;

transferring first charges accumulated in said imaging elements of every other one of said rows to said vertical shift registers;

shifting said first charges through said vertical shift registers to store them in said lines of memories;

transferring second charges accumulated in said imaging elements of the remaining rows to said vertical shift registers;

transferring a part of said first charges and a part of said second charges to said second and first horizontal shift registers, respectively; and shifting said transferred charges through one of said first and second horizontal shift registers to be output as an electrical signal through one of said first and second charge-voltage converters and said switch, followed by shifting said transferred charges through the other of said first and second horizontal shift registers to output as another electrical signal through the other of said first and second charge-voltage converters and said switch.

8. A CCD area image sensor comprising:

a semiconductor chip;

a structure of CCD imaging sensor for producing a signal for a interlace scanning system in response to light incident thereon, said structure including a matrix of imaging elements, a plurality of vertical shift registers formed in parallel with respective rows of said matrix, a first horizontal shift register formed on one side of said matrix and a first charge detector formed at one end of said first horizontal shift register;

a plurality of lines of memories formed on another side of said matrix opposite to said one side;

a second horizontal shift register formed on the same side of said matrix as said lines of memories; and a second charge detector formed at one end of said second horizontal shift register.

9. The CCD area image sensor as claimed in claim 8, wherein said second horizontal shift register is disposed between said lines of memories and said matrix.

10. The CCD area image sensor as claimed in claim 8, wherein said lines of memories are disposed between said second horizontal shift register and said matrix.

* * * * *